(12) United States Patent
Ivey et al.

(10) Patent No.: US 9,420,716 B2
(45) Date of Patent: Aug. 16, 2016

(54) ELECTRONIC MODULE INSTALLATION TOOLS FOR ELECTRONIC RACKS

(71) Applicant: Atlas Sound LP, Ennis, TX (US)

(72) Inventors: Johnathan Loyd Ivey, Chandler, AZ (US); David Billy Green, Waxahachie, TX (US); Mitch Hensley, Maricopa, AZ (US)

(*) Notice: Subject to any disclaimer, the term of this patent is extended or adjusted under 35 U.S.C. 154(b) by 325 days.

(21) Appl. No.: 13/933,327

(22) Filed: Jul. 2, 2013

(65) Prior Publication Data

US 2015/0014912 A1    Jan. 15, 2015

(51) Int. Cl.
    *H05K 7/14*    (2006.01)

(52) U.S. Cl.
    CPC .................... *H05K 7/1415* (2013.01)

(58) Field of Classification Search
    CPC .............. B25B 3/00; B25B 1/00; B25B 5/02;
        B25B 5/04; B25B 5/082; B25B 5/125; B25B
        1/02; B25B 1/2463; H05K 7/14; H05K
        7/1415; H05K 7/1409
    USPC .......... 269/309; 361/727, 754, 756, 759, 801, 361/802
    See application file for complete search history.

(56) References Cited

U.S. PATENT DOCUMENTS

| | | | | |
|---|---|---|---|---|
| 4,996,631 A * | 2/1991 | Freehauf | ....................... | 361/798 |
| 5,340,340 A * | 8/1994 | Hastings et al. | ................. | 439/64 |
| 5,673,171 A * | 9/1997 | Varghese et al. | .......... | 361/679.34 |
| 5,793,614 A * | 8/1998 | Tollbom | ........................ | 361/732 |
| 6,603,657 B2 * | 8/2003 | Tanzer et al. | ............ | 361/679.33 |
| 6,992,900 B1 * | 1/2006 | Suzue et al. | ................... | 361/801 |
| 7,301,778 B1 * | 11/2007 | Fang | .............................. | 361/759 |
| 7,397,674 B2 * | 7/2008 | Schlack | ........................ | 361/801 |
| 8,052,231 B2 * | 11/2011 | Rasmussen et al. | ........ | 312/265.6 |
| 8,295,055 B2 * | 10/2012 | Van Der Mee et al. | ....... | 361/759 |
| 8,325,487 B2 * | 12/2012 | Yamaguchi et al. | .......... | 361/752 |
| 8,435,057 B1 * | 5/2013 | Jun et al. | ........................ | 439/157 |
| 2004/0095716 A1 * | 5/2004 | McAlister | ..................... | 361/685 |
| 2007/0109760 A1 * | 5/2007 | Leung et al. | ................... | 361/798 |

OTHER PUBLICATIONS

Cables and Kits, Great Lakes 1RU 19" Tool-Less Rack Mount Filler Panel, IMI\oW,cablesanclkits.com'great-lales-1ru-19-toolless-rac~mount-filler-panel-p-5983,html?gclid=CL_65ce7j7gCFcR_QgD-dzIMIcA, Jul. 1, 2013, Buford, GA.
Rack Mount Solutions; Rack Mount Screws, Cage Nuts, Rack Mount Hardware, Cage Hardware; WNN. rackmountsolutions.net/Rackmount_Screws_Hardware.asp; Jul. 1, 2013.
Server Rack Accessories; Server Rack.Accesseories-19" Rack. Mount Accessories; 42u.com/server_racks_accessories.htm; Jul. 1, 2013.

* cited by examiner

*Primary Examiner* — Joseph J Hail
*Assistant Examiner* — Jon Taylor
(74) *Attorney, Agent, or Firm* — Keith L. Jenkins, Registered Patent Attorney, LLC; Keith L. Jenkins

(57) ABSTRACT

An electronic module installation tool temporarily supports electronic modules in electronic racks. The tool has a frame configured to be inserted into a rack and that has a top surface for supporting an electronics module. A front surface of the frame supports a faceplate and left and right manual clamps having a first pivot for the clamp handle relative to the frame and a second pivot for the clamp relative to the clamp handle. The faceplate extends to the left and right to create flanges that each support a pin carrier that supports rearwardly extending top and bottom vertically arrayed pins that are sized and spaced apart to align with holes in an attachment rail in the rack. A clamp extends between the pins and clamps to the rear side of the rail when the handle is operated. The tools may be made for various sizes of racks.

13 Claims, 6 Drawing Sheets

ELECTRONIC MODULE INSTALLATION TOOLS FOR ELECTRONIC RACKS

TECHNICAL FIELD

This invention relates to a tool to assist in mounting electronic modules into an electronics rack or cabinet. This invention more particularly relates to tools each sized and shaped to each of the variously sized and shaped electronic racks and cabinets.

BACKGROUND

Many electronic applications can be created with combinations of electronic modules connected together, and it is convenient to have all the modules for a particular purpose supported in a single structure. A common example is a household stereo component tool, which might include a radio receiver, various media players, content storage, and an amplifier. A more modern example would be a server farm. Electronic modules conventionally have signal and power couplings on the rear wall, or "back plane" of the module and controls and visual displays on the front wall, or "front plane", of the module.

The basic structure for supporting a plurality of electronic modules is a rack. Racks come in a variety of standard sizes to accommodate correspondingly-sized electronic modules. The standard sizes for racks and components are established by various industry organizations. A rack with side, top, and rear panels is referred to as a cabinet. Racks have vertical attachment rails that have holes of an industry-standard size and industry-standard spacing. Electronic modules are mounted in a rack by positioning perforated side flanges of the module in alignment with holes on the rails and inserting fasteners in through the flange perforations and through the holes in the rails. During the fastening procedure, the module must be supported in the aligned position while the fasteners are inserted. Frequently, this becomes a two-person task because the weight of some modules makes them unwieldy. In addition, maintaining alignment makes the fastening process slow.

Therefore, a need exists for a tool that assists in mounting electronic modules in electronics racks to speed up the process and to make it easier.

OBJECTS AND FEATURES OF THE INVENTION

A primary object and feature of the present invention is to overcome the above-mentioned problems and fulfill the above-mentioned needs.

Another object and feature of the present invention is to provide a tool that aligns with the rails by pins, clamps to the rails manually, and supports an electronic module in an aligned position for fastening. Another object of the invention is to provide a tool that can be easily clamped to the rails and unclamped from the rails by hand.

It is an additional primary object and feature of the present invention to provide such a tool that is efficient, inexpensive and handy. Other objects and features of this invention will become apparent with reference to the following descriptions.

SUMMARY OF THE INVENTION

An electronic module installation tool for electronic racks that has a frame sized and shaped to be inserted into an electronics rack. The tool has a top surface for temporarily supporting an electronics module while that module is fastened to the rack. A front surface of the frame supports a faceplate and left and right manual clamps having a first pivot for the clamp handle relative to the frame and a second pivot for the clamp relative to the clamp handle. The faceplate extends to the left and right to create flanges that each support a pin carrier that supports rearwardly extending top and bottom vertically arrayed pins that are sized and spaced apart to align with holes in attachment rails which are part of the electronics rack. A clamp extends between the pins and clamps to the rear side of the attachment rail when the handle is appropriately manipulated by the user. The illustrated embodiment herein is for nineteen-inch-wide electronics modules and associated racks and cabinets. However, tools for other sizes of racks are within the scope of the invention.

BRIEF DESCRIPTION OF THE DRAWINGS

The present invention will hereinafter be described in conjunction with the following drawing figures, wherein like numerals denote like elements.

DETAILED DESCRIPTION OF THE PRESENT INVENTION

Words of orientation, such as right, left, top, bottom, front, rear, etc., as used herein, are based on the device being in operational orientation and seen from the point of view of a person looking at the device from the front.

Figure 1:
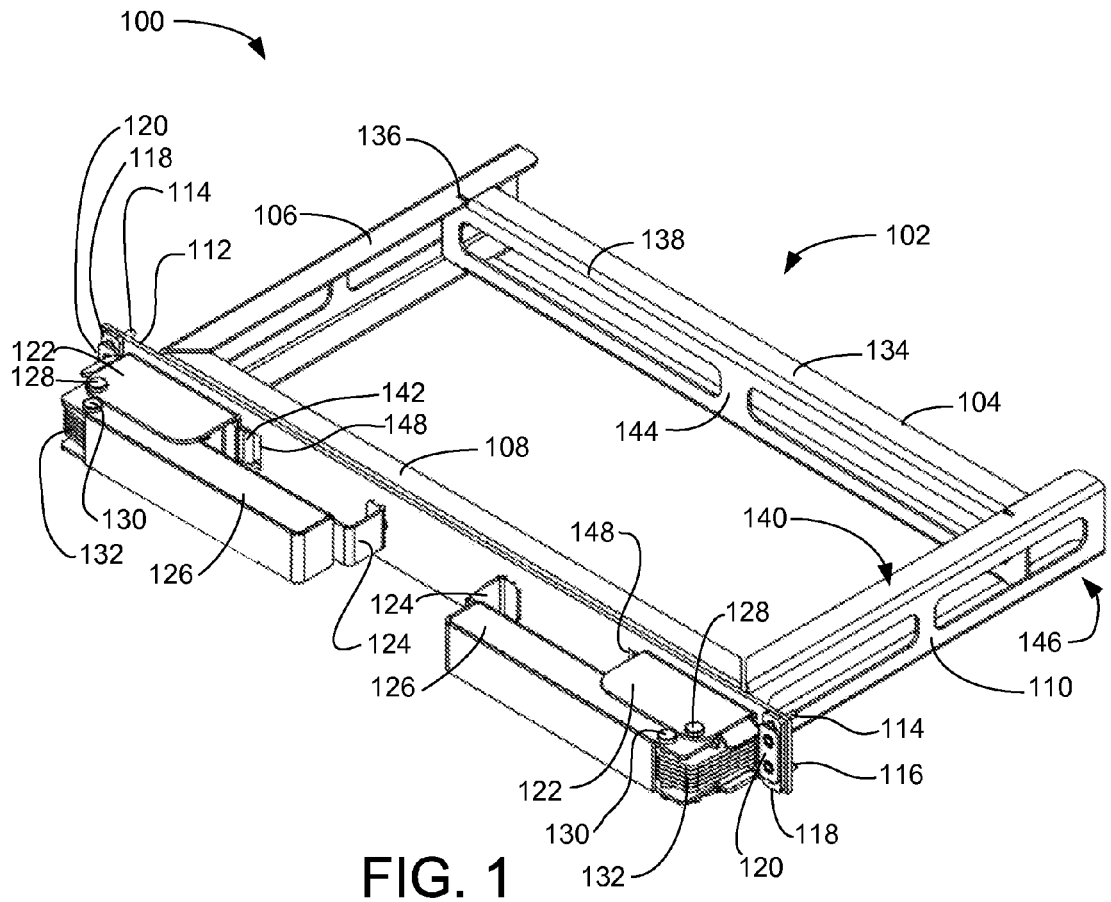
FIG. 1 is a top front perspective view illustrating an exemplary embodiment of an electronic module installation tool for electronic racks in a clamped configuration, according to a preferred embodiment of the present invention.

FIG. 1 is a top front perspective view illustrating an exemplary embodiment of an electronic module installation tool 100 for electronic racks in a clamped configuration, according to a preferred embodiment of the present invention. Tool 100 includes a frame 102 having rear frame member 104, left frame member 106, front frame member 108, and right frame member 110. In a particular embodiment, rear frame member 104 may be omitted. Preferably, left frame member 106, front frame member 108, and right frame member 110 are made from one piece. Preferably, left frame member 106, rear frame member 104, and right frame member 110 have openings 146 (one of six labeled) to reduce the weight of the frame. Frame rear member 104 includes vertical member 144 that has a bend 138 in a portion between left frame member 106 and right frame member 110 and that bend 138 extends into flange 134, which becomes part of frame top surface 140. Notches 136 (one of two labeled) in left frame member 106 and right frame member 110 receive an extension of vertical member 144 to assist in securing rear frame member 104 to left frame member 106 and right frame member 110. Frame top surface 140 supports an electronics module 802 (see FIG. 8) for fastening when tool 100 is installed in an electronics rack 702 (see FIG. 7 and FIG. 8). The dimensions of the frame 102 are important to proper fit within the rack 702 (see FIG. 7) and will be discussed in detail below. The exemplary illustrated embodiment will instruct those of ordinary skill in the art as to proper dimensions for various sizes of racks 702 (see FIG. 3).

Faceplate 112 is fixed to front frame member 108 and extends beyond the width of frame 102 to the left and the right, as shown. Hinge housing 122 has a U-shaped cross-section and abuts faceplate 112 and attaches by fasteners through faceplate 112 and front frame member 108, as will be discussed further below. Hinge housing 122 has an extension 142 that extends from the bottom of hinge housing 122 through faceplate 112 opening 148 to assist in securing hinge housing 122 to frame 102. Handle hinge pin 128 is supported by hinge housing 122 and pivots handle 124 and, indirectly, handle cover 126. Clamp hinge pin 130 is supported by handle 124 and pivots clamp 132.

Figure 5:
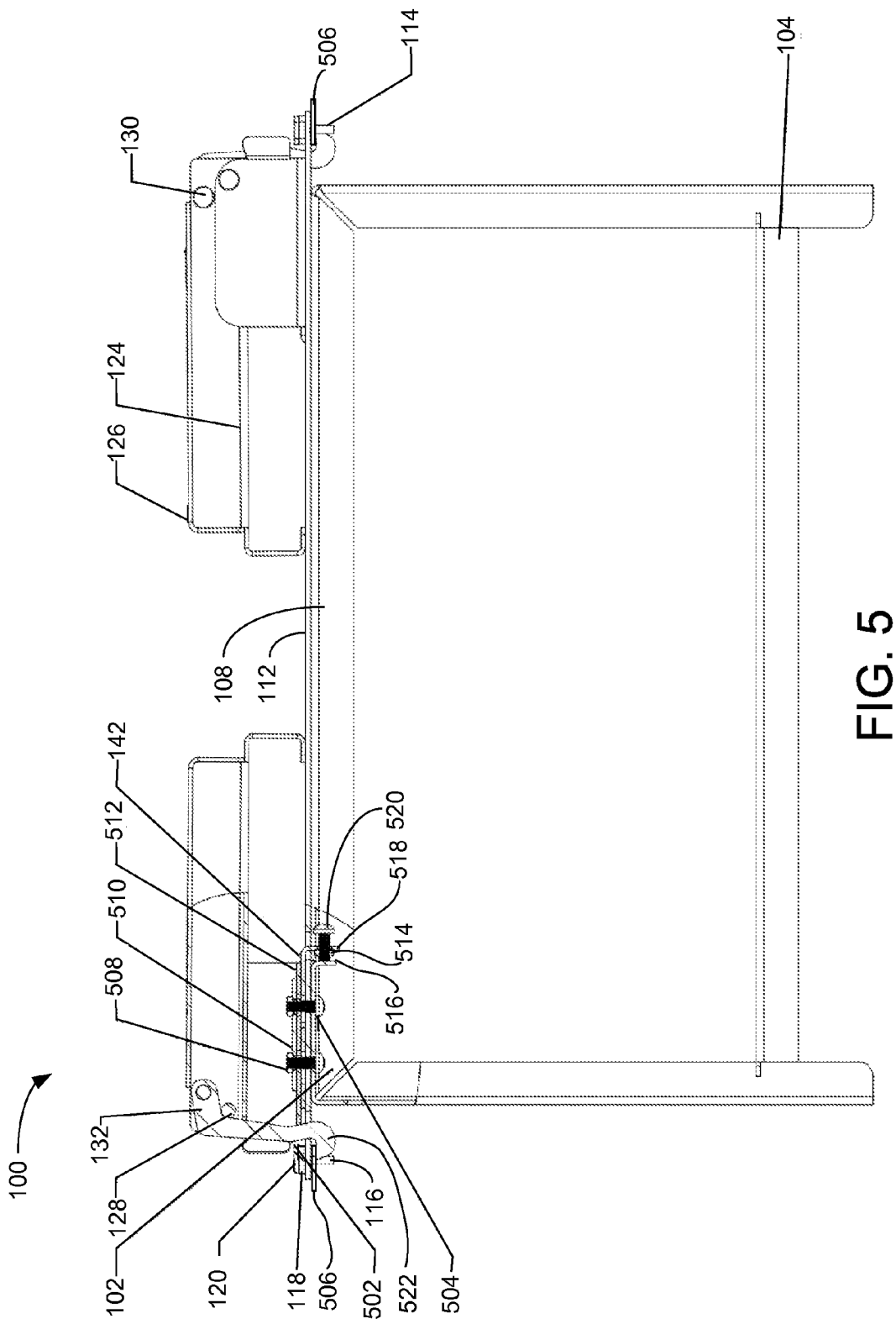
FIG. 5 is a top plan cutaway view illustrating the exemplary embodiment of the electronic module installation tool for electronic racks of FIG. 1, according to a preferred embodiment of the present invention.
Figure 7:
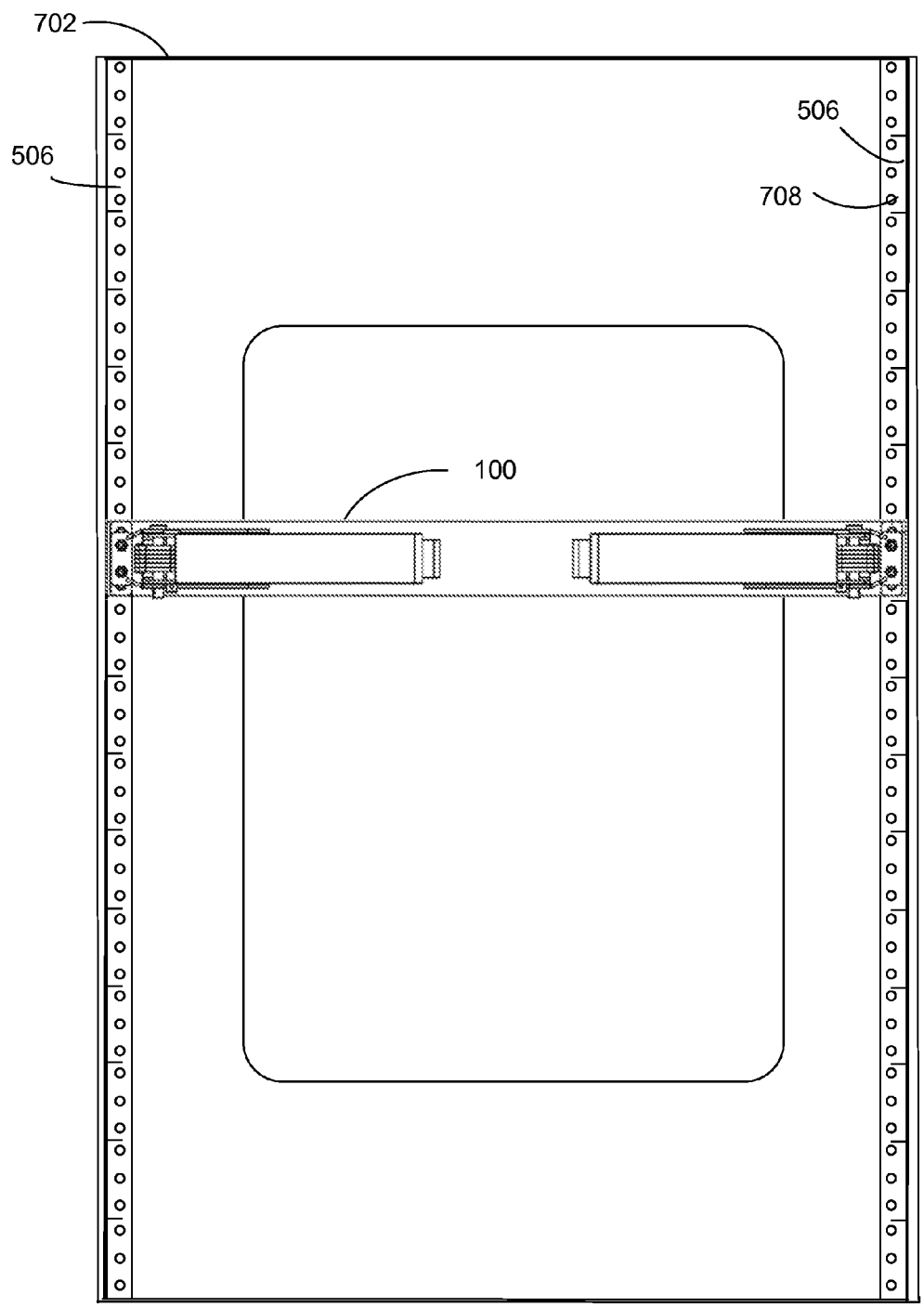
FIG. 7 is a front elevation view illustrating the exemplary embodiment of the electronic module installation tool for electronic racks of FIG. 1 installed in an electronics rack, according to a preferred embodiment of the present invention.

Top and bottom pins 114 and 116, respectively, are sized, spaced apart, and vertically arrayed to align with holes 708 in attachment rails 506 (see FIG. 5 and FIG. 7). Pins 114 and 116 are attached to a pin carrier 118 that is secured by retainer bar 120. Pin carrier 118 enables minor horizontal variability (plus or minus one thirty-second of an inch) in pin 114 and 116 location.

Figure 2:
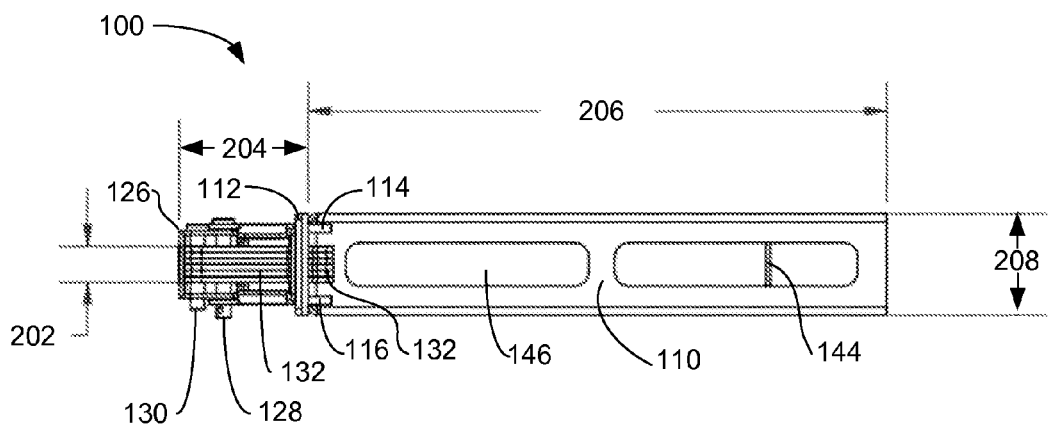
FIG. 2 is a side elevation view illustrating the exemplary embodiment of the electronic module installation tool for electronic racks of FIG. 1, according to a preferred embodiment of the present invention.

FIG. 2 is a side elevation view illustrating the exemplary embodiment of the electronic module installation tool 100 for electronic racks of FIG. 1, according to a preferred embodiment of the present invention. Hook-shaped clamp 132 preferably has a thickness 202 of 0.614 inches and extends through an opening in faceplate 112, as shown. The depth 206 of the frame 102 is preferably ten inches and the height 208 of the frame is preferably 1.750 inches. The depth 204 of the combined faceplate 112 and handles 124 is preferably 2.226 inches.

Figure 3:
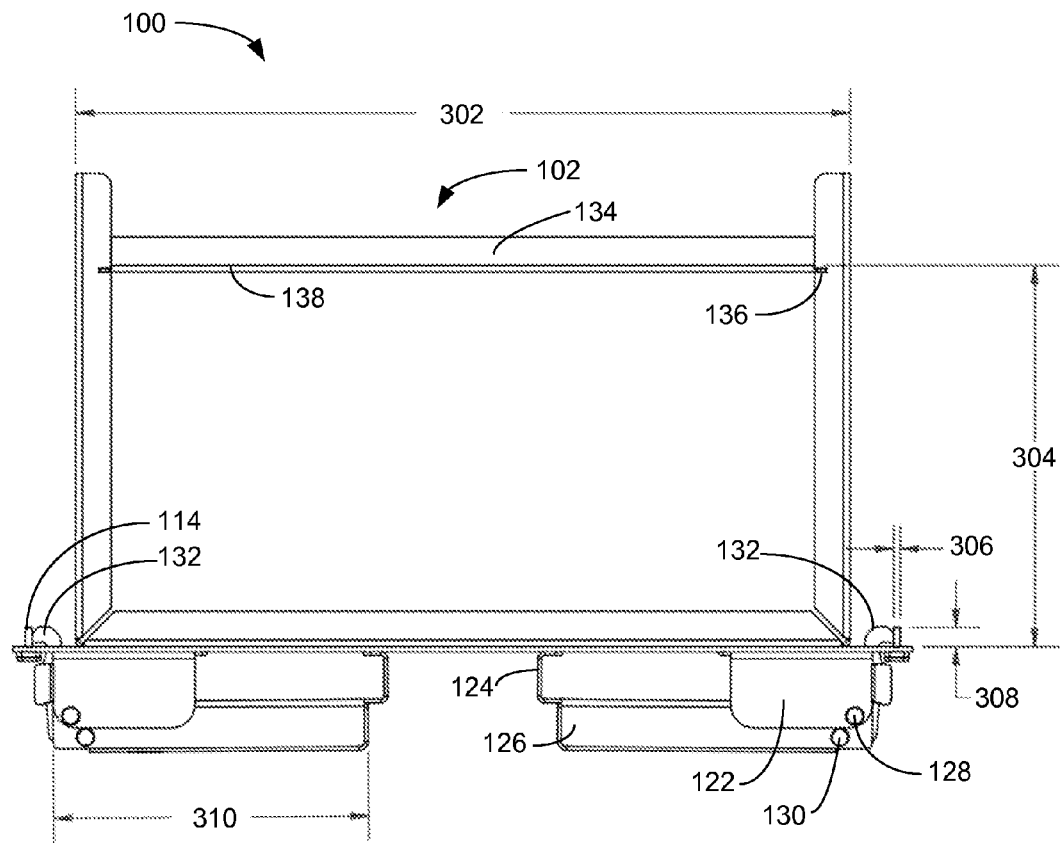
FIG. 3 is a top plan view illustrating the exemplary embodiment of the electronic module installation tool for electronic racks of FIG. 1, according to a preferred embodiment of the present invention.

FIG. 3 is a top plan view illustrating the exemplary embodiment of the electronic module installation tool 100 for electronic racks of FIG. 1, according to a preferred embodiment of the present invention. The width 302 of frame 102, centered on faceplate 112, is preferably 16.350 inches the depth 304 of the frame to the rear frame member 104 flange 134 is preferably 8.055 inches. The diameter 306 of pins 114 (one of two labeled) and 116 (not visible in this view) is preferably 0.141 inches and the extension 308 of pins 114 and 116 from the rear surface of the faceplate 112 is preferably 0.410 inches. The length 310 of handle cover 125 is preferably 6.649 inches.

Figure 4:
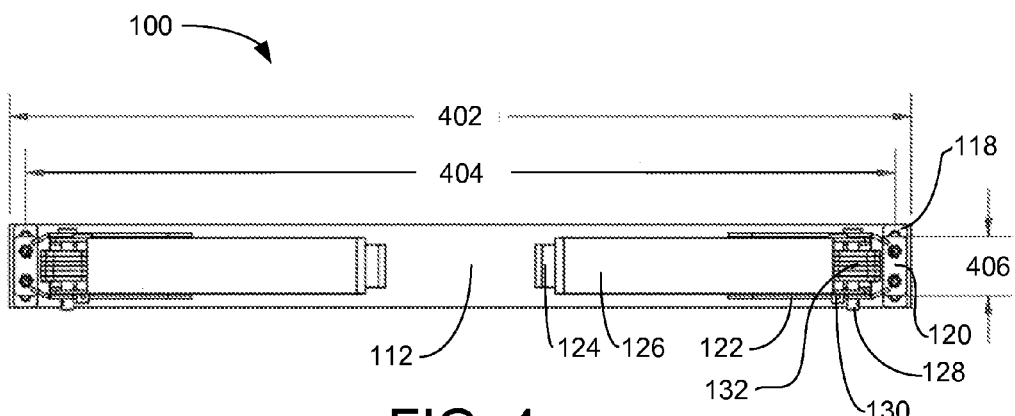
FIG. 4 is a front elevation view illustrating the exemplary embodiment of the electronic module installation tool for electronic racks of FIG. 1, according to a preferred embodiment of the present invention.

FIG. 4 is a front elevation view illustrating the exemplary embodiment of the electronic module installation tool 100 for electronic racks of FIG. 1, according to a preferred embodiment of the present invention. The width 402 of the faceplate 112 is preferably nineteen inches. The distance 404 between the vertical centerlines of pins 114 and 116 varies between 18.250 and 18.375 inches, due to motion of the pins 114 and 116 within pin carrier 118. The height 406 of retainer bar 120 is preferably 1.750 inches.

FIG. 5 is a top plan cutaway view illustrating the exemplary embodiment of the electronic module installation tool 100 for electronic racks of FIG. 1, according to a preferred embodiment of the present invention. Handle base 142 abuts faceplate 112 and supports guide plate 512 and nut plate 510 and faceplate 112 abuts front frame member 108. Bolts 504 (one of two labeled) and nuts 508 (one of two labeled) fasten together front frame member 108, handle base 142 (and, therefore hinge housing 122), guide plate 512 and nut plate 510. Handle base 142 has a right-angle handle base flange 518 that extends through opening 148 (see FIG. 1) and receives adjustment bolt 520 with captive nut 514. The bottom end of adjustable bolt 520 abuts a right-angle frame flange 516 of the front frame member 108 and so turning adjustment bolt 520 changes the distance between frame flange 516 and handle base flange 518 prior to tightening bolts 504.

Handles 124 are shown in the clamped position, and clamp 132 can be seen in top plan view within the cutaway. Electronics rack rails 506 are clamped to faceplate 112 by the hook end 522 of clamp 132, as shown. Pins 114 and 116 (one of each labeled in this view) penetrate holes 706 (see FIG. 7) in rails 506 to ensure proper alignment. Retainer bar 120 has a small spacer 502 to space clamp 132 away from the pin carrier 118 when clamp 132 is moving between the clamped and unclamped configurations.

Figure 6:
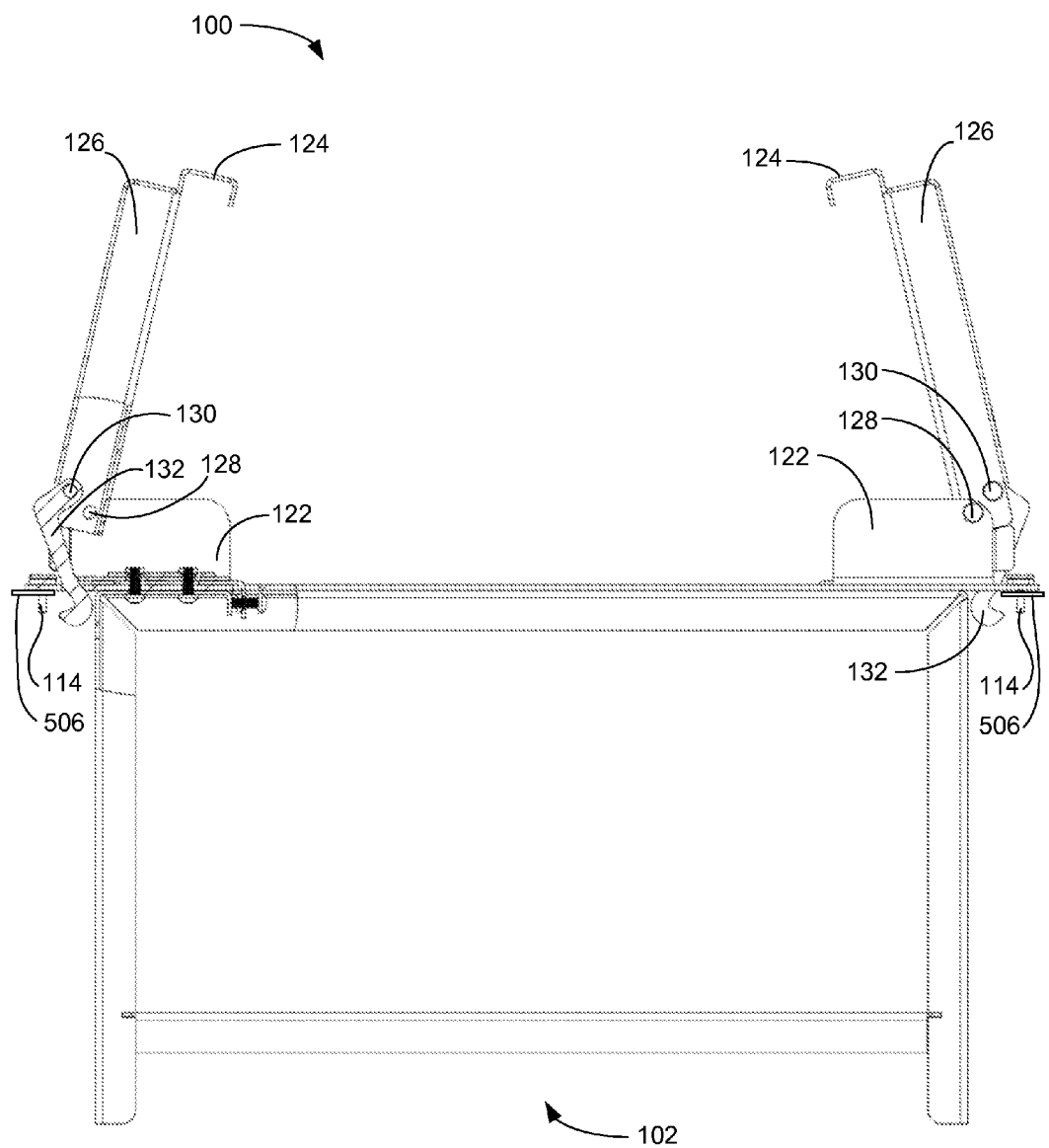
FIG. 6 is a top plan cutaway view illustrating the exemplary embodiment of the electronic module installation tool for electronic racks of FIG. 1 in an unclamped configuration, according to a preferred embodiment of the present invention.

FIG. 6 is a top plan cutaway view illustrating the exemplary embodiment of the electronic module installation tool 100 for electronic racks of FIG. 1 in an unclamped configuration, according to a preferred embodiment of the present invention. Clamp 132 can be seen to have been released from rail 506 which allows pins 114 and 116 to be withdrawn from rail 506 as tool 100 is withdrawn from or inserted into rails 506 of rack 702 (see FIG. 7). Clamp hinge pin 130 is mechanically connected to handle 124. In an additional embodiment, clamp hinge pin 130 may be supported by handle cover 126.

FIG. 7 is a front elevation view illustrating the exemplary embodiment of the electronic module installation tool 100 for electronic racks of FIG. 1 installed in an electronics rack 702, according to a preferred embodiment of the present invention. Tool 100 is shown clamped to rails 506 and ready to support an electronics module 802 (see FIG. 8).

Figure 8:
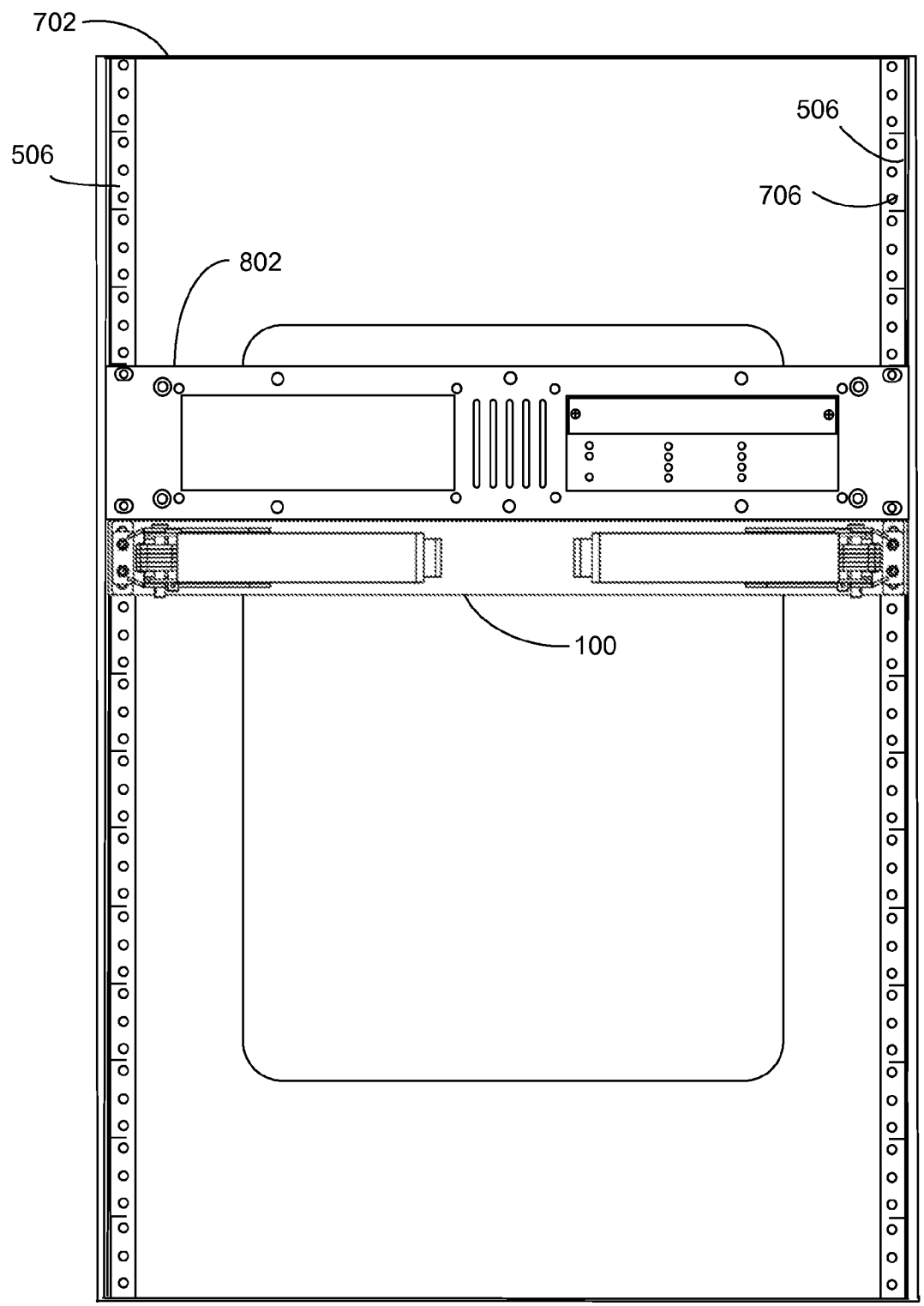
FIG. 8 is a front elevation view illustrating the exemplary embodiment of the electronic module installation tool for electronic racks of FIG. 1 supporting an electronics module for installation in an electronics racks, according to a preferred embodiment of the present invention.

FIG. 8 is a front elevation view illustrating the exemplary embodiment of the electronic module installation tool 100 for electronic racks of FIG. 1 supporting an electronics module 802 for installation in an electronics rack 702, according to a preferred embodiment of the present invention.

The embodiments presented herein are exemplary and are not intended to be limiting within the bounds of enablement provided in the specification and the legal boundaries in the claims below. Various substitutions of materials and changes in design that are not dysfunctional for the tool claimed are within the scope of the invention.

We claim:

1. An electronic module installation tool for assisting in mounting at least one electronics module in an electronics rack, the tool comprising:
   a. a frame having a front frame member;
   b. a faceplate attached to a front side of said front frame member of said frame; and c. first and second clamping mechanisms attached at least to first and second opposed end portions, respectively, of said faceplate, wherein each said clamping mechanism of said first and second clamping mechanisms comprises:
  i. first and second alignment pins for aligning said tool to first and second holes, respectively, in an attachment rail of said electronics rack; and
  ii. a clamp operable to clamp said tool to said rail;
d. wherein said first and second clamping mechanisms comprise:
  i. first and second said clamps, respectively; and
  ii. first and second clamp pivots supported by said first and second handles, respectively, enabling said first and second clamps, respectively, to pivot with respect to said first and second handles, respectively;
e. first and second handles for manually operating said first and second clamping mechanisms; and
f. wherein:
  i. said first and second handles comprises first and second handle covers, respectively; and
  ii. said first and second clamp pivots are supported by said first and second handle covers, respectively.

2. The tool of claim 1, wherein said first and second clamping mechanisms comprise:
a. first and second hinge housings, respectively each having a U-shaped cross section; and
b. first and second handle pivots enabling said first and second handles, respectively, to pivot with respect to said first and second hinge housings, respectively.

3. The tool of claim 2, wherein:
a. said faceplate comprises first and second faceplate openings;
b. said front frame member comprises first and second frame openings aligned to said first and second faceplate openings; and
c. said first and second hinge housings comprise first and second extensions, respectively, extending through said first and second faceplate openings and said first and second frame openings.

4. The tool of claim 3, wherein said first and second hinge housings are fastened to said faceplate and to said front frame member.

5. The tool of claim 1, wherein said first and second clamps comprise first and second hook ends, respectively, that engage first and second rear surfaces of first and second said rails in said electronics rack when said tool is in a clamped configuration.

6. The tool of claim 1, wherein said each said clamping mechanism comprises a pin carrier operable to maintain said first and second pins in a vertical spaced-apart relationship and allow variation in the horizontal position of each pin of said first and second pins.

7. The tool of claim 1, wherein said clamp extends between said first and second pins.

8. The tool of claim 1, wherein said frame comprises first and second pieces and said first piece comprises three sides of said frame.

9. An electronic module installation tool for assisting in mounting at least one electronics module in an electronics rack, the tool comprising:
a. a frame having a front frame member;
b. a faceplate attached to a front side of said front frame member of said frame; and
c. first and second clamping mechanisms attached at least to first and second opposed end portions, respectively, of said faceplate, wherein each said clamping mechanism of said first and second clamping mechanisms comprises:
  i. first and second alignment pins for aligning said tool to first and second holes, respectively, in an attachment rail of said electronics rack;
  ii. a pin carrier operable to maintain said first and second pins in a vertical spaced-apart relationship and allow variation in the horizontal position of each pin of said first and second pins; and
  iii. a clamp operable to clamp said tool to said rail;
d. wherein said first and second clamping mechanisms comprise:
  i. first and second handles, respectively, for manually operating said first and second clamping mechanisms;
  ii. first and second hinge housings, respectively, each having a U-shaped cross section; and
  iii. first and second handle pivots enabling said first and second handles, respectively, to pivot with respect to said first and second hinge housings, respectively;
  iv. first and second said clamps, respectively; and
  v. first and second clamp pivots supported by said first and second handles, respectively, enabling said first and second clamps, respectively, to pivot with respect to said first and second handles, respectively; and
e. wherein:
  i. said first and second handles comprises first and second handle covers, respectively; and
  ii. said first and second clamp pivots are supported by said first and second handle covers, respectively.

10. The tool of claim 9, wherein said first and second clamps comprise first and second hook ends, respectively, that engage first and second rear surfaces of first and second said rails in said electronics rack when said tool is in a clamped configuration.

11. The tool of claim 9, wherein said clamp extends between said first and second pins.

12. The tool of claim 9, wherein:
a. said faceplate comprises first and second faceplate openings;
b. said front frame member comprises first and second frame openings aligned to said first and second faceplate openings, respectively; and
c. first and second hinge housings comprise first and second extensions, respectively, extending through said first and second faceplate openings and said first and second frame openings, respectively; and
d. said first and second hinge housings are fastened to said faceplate and to said front frame member.

13. An electronic module installation tool for assisting in mounting at least one electronics module in an electronics rack, the tool comprising:
a. a frame having a front frame member;
b. a faceplate attached to a front side of said front frame member of said frame;
c. first and second clamping mechanisms attached at least to opposed end portions of said faceplate, wherein each said clamping mechanism comprises:
  i. first and second alignment pins for aligning said tool to first and second holes, respectively, in an attachment rail of said electronics rack;
  ii. a pin carrier operable to maintain said first and second pins in a vertical spaced-apart relationship and allow variation in the horizontal position of each pin of said first and second pins;
  iii. a clamp operable to clamp said tool to said rail;

iv. said clamp extends between said first and second pins; and
d. wherein:
  i. first and second said clamps comprise first and second hook ends, respectively, that engage first and second rear surfaces of first and second said rails in said electronics rack when said tool is in a clamped configuration;
e. wherein said first and second clamping mechanisms comprise:
  i. first and second handles, respectively, for manually operating said first and second clamping mechanisms;
  ii. first and second hinge housings each having a U-shaped cross section, respectively; and
  iii. first and second handle pivots enabling said first and second handles, respectively, to pivot with respect to said first and second hinge housings, respectively;
  iv. first and second said clamps, respectively; and
  v. first and second clamp pivots supported by said first and second handles, respectively, enabling said first and second clamps, respectively, to pivot with respect to said first and second handles, respectively; and
f. wherein:
  i. said first and second handles comprises first and second handle covers, respectively; and
  ii. said first and second clamp pivots are supported by said first and second handle covers, respectively.

\* \* \* \* \*